United States Patent [19]
Gourse et al.

[11] Patent Number: 4,810,947
[45] Date of Patent: Mar. 7, 1989

[54] DIGITAL ERROR DETECTOR FOR IFM RECEIVER

[75] Inventors: Stanley Gourse, Highland; Jacob Rozmaryn, Silver Spring; Dennis L. Kershner, Elkridge, all of Md.

[73] Assignee: Litton Systems, Inc., Beverly Hills, Calif.

[21] Appl. No.: 153,253

[22] Filed: Feb. 8, 1988

[51] Int. Cl.[4] ............................................. G01R 23/16
[52] U.S. Cl. ..................................... 324/77 R; 375/86; 342/393; 342/196
[58] Field of Search ................ 324/77 R, 77 A, 77 B, 324/77 D, 77 E, 77 F, 77 G, 77 H, 78 R, 78 D, 79 R, 79 D, 83 D; 375/56, 87, 86; 455/183; 342/196, 110, 137, 393

[56] References Cited

U.S. PATENT DOCUMENTS

| | | | |
|---|---|---|---|
| 3,859,631 | 1/1975 | Holmes et al. | 375/87 |
| 3,928,797 | 12/1975 | Kiencke et al. | 324/78 D |
| 4,484,221 | 11/1984 | Tults | 455/183 |
| 4,580,277 | 4/1986 | Angello et al. | 375/56 |
| 4,698,827 | 10/1987 | Kretschmer | 375/86 |

*Primary Examiner*—Michael J. Tokar
*Attorney, Agent, or Firm*—Poms, Smith, Lande and Rose

[57] ABSTRACT

A process and means for identifying erroneous frequency measurements made by an IFM receiver using a multi-channel delay line discriminator. Expected phase codes are compared with measured phase codes. An error signal is generated when the magnitude of deviation exceeds a predetermined amount. Preferred formulas are used to compute the expected phase codes and the deviation magnitude.

15 Claims, 1 Drawing Sheet

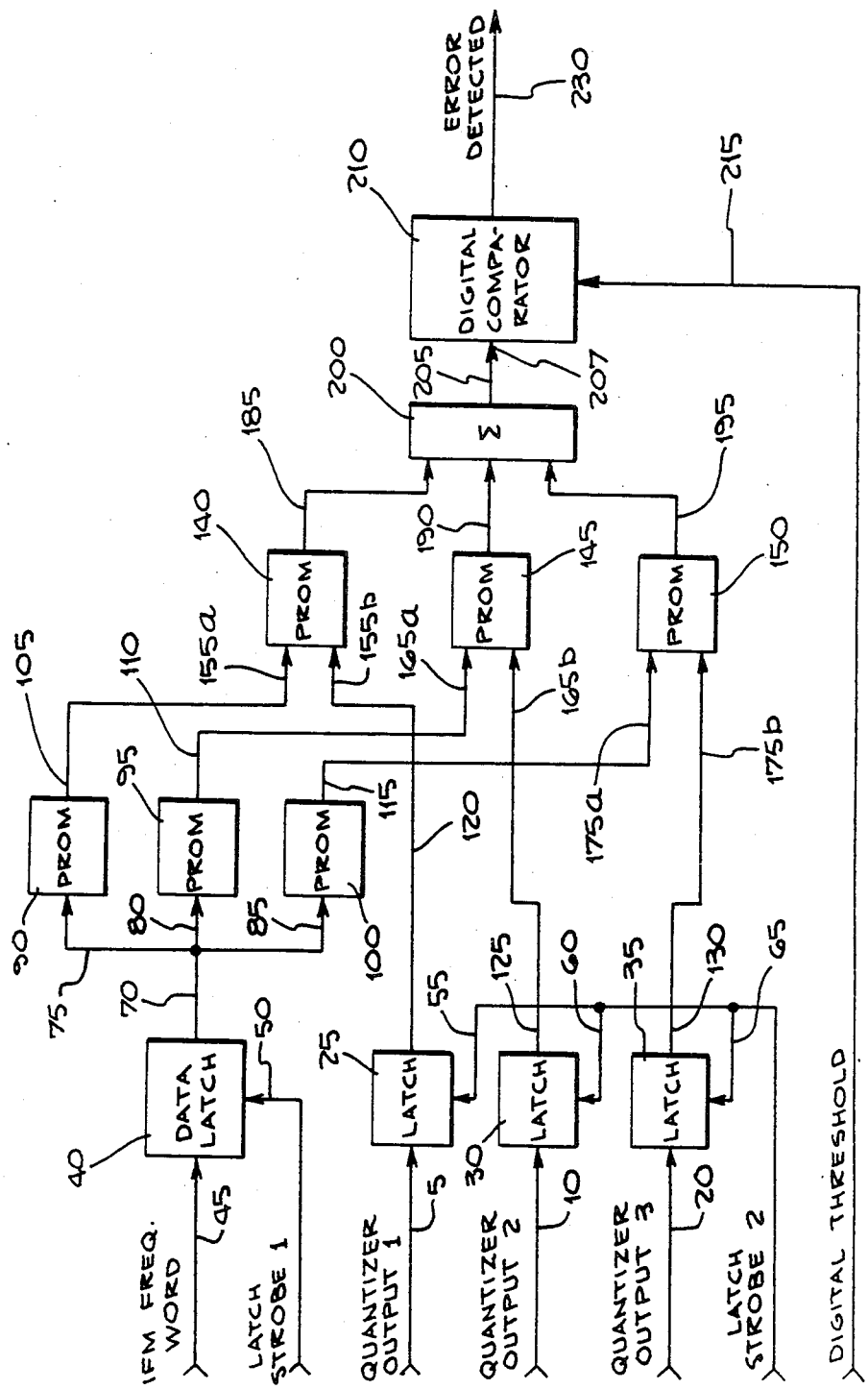

DIGITAL ERROR DETECTOR FOR IFM RECEIVER

BACKGROUND OF THE INVENTION

1. Field of the Invention

This invention relates to electronic supports measures (ESM) systems and, more particularly, to apparatus for detecting an erroneous frequency measurement made by an instantaneous frequency measurement (IFM) receiver using a multi-channel delay line discriminator.

2. Description of Related Art

An instantaneous frequency measurement of a detected radar signal is commonly made in an electronic support measures (ESM) system in order to identify the source of the detected radar signal.

In a typical system, the detected radar signal is sent through a delay line. This causes the signal to undergo a phase shift which is directly related to the frequency of the detected signal. The phase shift is then measured and, based thereon, the frequency of the detected signal is calculated.

To maximize band width and measuring accuracy, the detected radar signal is often delivered simultaneously to several delay lines of progressively greater length and each resulting phase delay is measured. Such a system is known as a multi-channel delay line discriminator. All phase shift measurements are then fed to a frequency resolver which analyses them and, based thereon, provides an output indicative of the actual frequency of the detected radar signal.

In such a system, the phase shift measurements are typically delivered in the form of a multi bit digital word commonly referred to as a "measured phase code." The output from the frequency resolver is also typically delivered in the form of a multi bit digital word. It is commonly referred to as the "measured frequency word."

A significant problem in such IFM systems is the loss of accuracy which results when two incoming signals are present at the same time or when the signal level is too low. This often causes an error in one or more of the measured phase codes and, often (but not always) as a consequence, in the measured frequency word.

Attempts have been made to avoid this problem by sensing the existence of the error-creating problem, i.e., the presence of two signals at once or a signal of insufficient level.

Unfortunately, such efforts have generally required expensive and complicated circuitry. They also have not generally worked well.

SUMMARY OF THE INVENTION

One object of the present invention is to provide apparatus which identifies erroneous frequency measurements being made by an instantaneous frequency measurement receiver.

Another object of the present invention is to make such an identification with relatively simple and inexpensive circuitry and in an effective manner.

These and other objects of the present invention are accomplished by comparing the measured phase codes with expected phase codes, i.e., the phase codes which one would ideally have expected to have been generated by a signal having the measured frequency. If the deviations between the two exceed a predetermined amount, the frequency measurement is flagged as being erroneous.

The expected phase codes are derived from the measured frequency word produced by the instantaneous frequency measurement (IFM) receiver. This is accomplished in the preferred embodiment by having this word serve as the address line input to a set of programmable read-only memories (PROMS) which contain the expected phase code for each frequency.

These expected phase codes, along with the measured phase codes, are then fed to the address lines of another set of programmable read only memories (PROMS) which contain the square of the difference between the expected and measured phase codes. All squared differences, i.e. the output from this second set of PROMS, are then added together and compared with a predetermined threshold. If the threshold is exceeded, the measurement is tagged as being erroneous.

BRIEF DESCRIPTION OF THE DRAWING

A block drawing is shown of the basic elements of the preferred embodiment of the present invention.

DESCRIPTION OF THE PREFERRED EMBODIMENT

The preferred embodiment of the present invention has been designed to work in conjunction with an IFM receiver which uses a multi-channel delay line discriminator to develop four measured phase codes (called quantizer outputs), each in a 4-bit digital format, one measured frequency word in a 10-bit digital format, and two digital strobe signals, one for the four measured phase codes (called latch strobe 2) and one for the measured frequency word (called latch strobe 1), each being actuated by the receiver when the respective data which they represent is present for analysis.

Each delay line within the discriminator of the receiver also has what is known as an unambiguous band width. This is the frequency deviation range over which the delay line and its associated phase comparator can unambiguously measure. It is equivalent to 1/T, where T is the delay time. In the preferred embodiment, four delay lines are used in the receiver which have an unambiguous band width of 40, 160, 640 and 2560 megahertz, respectively.

It is to be understood that the present invention is also applicable to a broad variety of differently formatted receivers, including those developing a different number of measured phase codes, those having measured phase codes or a measured frequency word of different bit length, and those having delay lines of different unambiguous frequency band width. In such a case, the preferred embodiment would be modified to match these differences in accordance with what will next become readily apparent to those of ordinary skill in the art.

As can be seen in the FIGURE, the preferred embodiment of the present invention includes quad latches 25, 30 and 35. Each quad latch as is well known contains 4 separate digital latch circuits within a single package.

Quad latches 25, 30 and 35 have connected to their respective quad inputs 5, 10 and 20 three of the four quantizer outputs 1, 2 and 3 which are developed by the IFM receiver (not shown). (The fourth quantizer output is developed from the longest delay line in the receiver and is not processed in the preferred embodiment.) The latch strobe 2 output from the receiver signals the presence of quantizer outputs 1, 2 and 3 and is connected to clock inputs 55, 60 and 65 of quad latches 25, 30 and 35. (If the receiver develops a different number of quantizer outputs, the number of phase code quad latches would be changed to be one less than said different number. Similarly, if the bit width of the quantizer outputs is different than 4-bits, the storage size of each latch would also be changed to match.)

A 10-bit latch 40 similarly has an input 45 connected to receive the measured IFM frequency word which is developed by the IFM receiver. (If the receiver develops a measured frequency word of different bit width, the bit width of latch 40 would be adjusted to match.) The latch strobe 1 output from the receiver signals the presence of the measured frequency word at input 45 and is connected to a clock input 50 of 10 bit latch 40.

As is well known in the art, a latch is a device which retains at its output the value of its input following strobing of its clock. In the present case, the purpose of latches 25, 30, 35 and 40 is to create a temporary record of the value of quantizer outputs 1, 2 and 3 and the IFM frequency word, respectively, for further analysis. In this way, the value of these input signals can later be analyzed, even though they may subsequently be removed by the receiver.

The strobed measured frequency word present at output lines 70 of the latch 40 is decoded into expected phase codes by routing output line 70 to three 10-bit wide address inputs 75, 80 and 85 of programmable readonly memories (PROMS) 90, 95 and 100. (If the bit width of the measured frequency word is different than 10-bits, the width of these address lines would be changed to match.)

As is well known in the art, a PROM is a memory device which is programmed to contain desired information at every address of the memory. In the present case, each address in PROM 90 is programmed to contain the phase code which ideally would be generated by quantizer output 1 for each measured frequency word. The codes programmed into PROMS 95 and 100 would be the same, except that they would be the codes ideally generated by quantizer outputs 2 and 3, respectively, for each measured frequency word. (If the amount of quantizer outputs were different than 4, the amount of PROMS would accordingly be changed to one less than said amount.)

Although all methodologies for computing these expected codes are considered to be within the scope of the present invention, the preferred embodiment computes these expected codes based on the following equation:

$$E = 2^n [f/B] \, MOD \, (2^n),$$

wherein E is the expected phase code for a particular quantizer output, n is the number of bits in the quantizer output, f is the frequency indicated by the measured frequency word, and B is the unambiguous band width of the delay line associated with that quantizer output.

In practice, this computation generally will not yield a whole number, but rather will also have a decimal portion which often could be carried out to an infinite number of places. Since the quantizer outputs are only 4 bits wide, however, far greater precision in the expected phase codes would be of little value.

Still, some precision beyond 4 bits is desireable to show how far a particular 4-bit quantizer output, even if a correct one, is from the ideal. In the preferred embodiment, therefore, the computation is computed to the nearest 1/16 of a bit. This results in an 8-bit expected phase code, the first 4 bits being comparable to the quantizer output, and the last 4-bits indicating the deviation of the correct truncated 4-bit quantizer output from the ideal to the nearest 1/16 of a bit.

Thus, in the preferred embodiment PROMS 90, 95 and 100 each produce an 8-bit expected code. (The bit width of the codes produced by PROMS 90, 95 and 100 could be different, however, if a different precision was desired or if the bit width of the quantizer outputs were different.)

It is also to be understood that these expected phase codes could be generated through a variety of means other than PROMS, such as a direct computing circuit programmed with an appropriate equation, such as the one above. All of such techniques are considered to be within the scope of the present invention.

Outputs 105, 110 and 115 from PROMS 90, 95 and 100, respectively, thus signal the programmed and expected phase code for each input frequency present on line 70 and, respectively, for each quantizer output 1, 2, and 3.

Each expected phase code is then subtracted from its associated quantizer output. The individual results of these subtractions are then squared and added together.

This computation is in accordance with the following preferred equation:

$$\sum_{n=1}^{N} (Q_{En} - Q_{An})^2$$

wherein N is the number of quantizer outputs for which an expected phase code is generated, $Q_{En}$ is the value of the expected phase code generated for the quantizer code output n, and $Q_{An}$ is the value of the quantizer code output n.

This sum is then compared with a threshold reference. If the sum is greater than the threshold, an erroneous measurement is indicated.

In the preferred embodiment, these subtractions and squarings are performed by PROMS 140, 145 and 150, each of which has 12-bit address line inputs 155 (a and b), 165(a and b) and 175(a and b), respectively. (If the bit widths of the expected phase codes or quantizer outputs were different, the width of these address line inputs would be changed to match.)

To achieve this, each expected phase code output 105, 110 and 115 is fed to eight of the 12-bit address line inputs of PROMS 140, 145 and 150, namely lines 155a, 165a and 175a, respectively. In addition, strobed quantizer outputs 120, 125 and 130 are similarly routed to the remaining four bit address line inputs of PROMS 140, 145 and 150, namely lines 155b, 165b and 170b, respectively.

Each PROM is programmed to output on lines 185, 190 and 195, respectively, an 8-bit digital word which represents the squared difference between the latched quantizer outputs and expected phase codes being imputed to its respective address input lines. (A different output bit width could be used if a different computing accuracy was desired.)

Although PROMS have been chosen in the preferred embodiment, it is to be understood that this computation can also be made by a variety of other means, including a computational circuit programmed with the desired equation. It is also to be understood that many other formulas could be used to compile the deviation between quantizer outputs and expected phase codes, such as rasing the difference to a power other than two, all again within the scope of the present invention.

The resulting squared differences present on lines 185, 190 and 195 are then added together by a summer 200. The total is outputed from summer 200 on eight-bit wide output lines 205 which are connected to eight-bit wide input lines 207 of a comparator 210. The comparator 210 then compares the computed value present at input lines 207 with a digital threshold value being inputed to comparator 210 over second eight-bit wide input lines 215. If the value present on input lines 207 is greater than the digital threshold present on input lines 215, the output of the comparator, line 220, is energized to indicate a detected error at output 230.

Although a low threshold value will obviously result in a high degree of error detection, it may also result in a high degree of false error detection. This may occur because the frequency resolver which is contained within the IFM receiver can sometimes indicate the correct frequency, even though a particular quantizer output is incorrect. Because the subject invention does not know what the correct frequency is, but only whether a quantizer output has strayed excessively from its ideal, it can therefore tag a perfectly valid frequency measurement as being invalid.

As a result, setting the threshold value on lines 215 requires a compromise between the desire to detect all erroneous frequency measurements and the desire to minimize false indications of erroneous frequency measurement.

Based on an empirical study and the parameter values used in conjunction with the preferred embodiment discussed herein, applicant has found that threshold values between 2.5 and 4 work best, with a value of 3.375 appearing to provide the most optimum result. (The whole number portion of the values represent the value of the four most significant bits of the input lines while the decimal portion represents the value of the four least significant bits of the input lines.)

Having described the preferred embodiment of the present invention, it should be understood by those skilled in the art that the within disclosure is exemplary only and is not an exhaustive listing of all of the materials and process parameters and that various other alternatives, adaptions and modifications may be made within the scope of the present invention. Accordingly, the present invention is not limited to the specific embodiment described and or illustrated herein, but only by the following claims.

What is claimed is:

1. Apparatus for identifying erroneous frequency measurements made by a system which provides a frequency measurement output and a plurality of measured phase code outputs, comprising:
   a. input means connected to the frequency measurement output for inputting the frequency measurement output;
   b. computing means connected to said input means for computing the deviation between at least one of the measured phase codes and the phase code which ideally would have been expected to have been generated based on the frequency measurement output; and
   c. output means connected to said computing means for generating an error detected signal wherever said computed deviation exceeds a predetermined amount.

2. Apparatus for identifying erroneous frequency measurements made by a system which provides a frequency measurement output and a plurality of measured phase code outputs, comprising:
   a. generation means connected to the frequency measurement output for generating an expected phase code for at least one of the measured phase code outputs based on the frequency of the frequency measurement output;
   b. deviation means connected to said generation means and to each measured phase code for which an expected phase code has been generated for generating a deviation signal representing the deviation between each of said expected phase codes and its associated measured phase code; and
   c. threshold means connected to said deviation means for generating an error detected signal when the magnitude of said deviation signal exceeds a predetermined amount.

3. The apparatus of claim 2, wherein the system outputs four measured phase codes.

4. The apparatus of claim 2, wherein the frequency measurement output is a 10-bit digital word.

5. The apparatus of claim 2, wherein said generation means includes a programmable read only memory.

6. The apparatus of claim 2, wherein each measured phase code is outputed as a digital signal and wherein each expected phase code is substantially equivalent to:

$$2^n[f/B] \mod (2^n),$$

wherein n is the number of bits in the measured phase code, f is the frequency indicated by the frequency measurement output, and B is the unambiguous band width of the delay line associated with the measured phase code.

7. The apparatus of claim 2, wherein the resolution accuracy of each expected phase code is greater than the resolution accuracy of its associated measured phase code.

8. The apparatus of claim 7, wherein the resolution accuracy of each expected phase code is 16 times the resolution accuracy of its associated measured phase code.

9. The apparatus of claim 2, wherein said deviation signal is substantially equivalent to:

$$\sum_{n=1}^{N} (Q_{En} - Q_{An})^2$$

wherein N is the number of measured phase code outputs for which an expected phase code is generated, $Q_{En}$ is the valve of the expected phase code generated for the measured phase code output n, and $Q_{An}$ is the value of the measured phase code output n.

10. The apparatus of claim 2, wherein said threshold means includes a digital comparator.

11. The apparatus of claim 2, wherein said predetermined amount is within the range of 2.5–4.0.

12. The apparatus of claim 11, wherein said predetermined amount is 3.375.

13. Apparatus for identifying erroneous frequency measurements emanating from an IFM receiver containing a multi-channel delay line discriminator which outputs in digital format a frequency measurement and a plurality of measured phase codes, comprising:

a. generation means connected to the frequency measurement output for generating an expected phase code for at least one of the measured phase code outputs substantially equivalent to:

$$2^n[f/B] \text{ MOD } (2^n),$$

wherein n is the number of bits in the measured phase code, f is the frequency indicated by the frequency measurement output, and B is the unambiguous band width of the delay line associated with the measured phase code, the resolution accuracy of each expected phase code being greater than the resolution accuracy of its associated measured phase code;

b. deviation means connected to said generation means and to each measured phase code for which an expected phase code has been generated for generating a deviation signal substantially equivalent to:

$$\sum_{n=1}^{N} (Q_{En} - Q_{An})^2$$

wherein N is the number of measured phase code outputs for which an expected phase code is generated, $Q_{En}$ is the value of the expected phase code generated for the measured phase code output n, and $Q_{An}$ is the value of the measured phase code output n; and c. threshold means connected to said deviation means for generating an error detected signal when the magnitude of said deviation signal exceeds a predetermined amount.

14. A process for identifying erroneous frequency measurements emanating from an IFM receiver containing a multi-channel delay line discriminator which outputs a frequency measurement and a plurality of measured phase codes, comprising the steps of:

a. reading the value of the frequency measurement output;

b. generating an expected phase code for at least one of the measured phase code outputs based on the frequency of the frequency measurement output;

c. determining the amount of deviation between each of said expected phase codes and its associated measured phase code output; and d. generating an error detected signal when the magnitude of said deviation exceeds a predetermined amount.

15. The process of claim 14, wherein:

a. each expected phase code is substantially equivalent to:

$$2^n[f/B] \text{ MOD } (2^n),$$

wherein n is the number of bits in the measured phase code, f is the frequency indicated by the frequency measurement output, and B is the unambiguous band width of the delay line associated with the measured phase code;

b. each expected phase code has a resolution accuracy greater than the resolution accuracy of its associated measured phase code; and c. said deviation is determined substantially in accordance with the following formula:

$$\sum_{n=1}^{N} (Q_{En} - Q_{An})^2$$

wherein N is the number of measured phase code outputs for which an expected phase code is generated, $Q_{En}$ is the value of the expected phase code generated for the measured phase code output n, and $Q_{An}$ is the value of the measured phase code output n.

* * * * *